(12) United States Patent
Kataoka et al.

(10) Patent No.: US 10,404,275 B2
(45) Date of Patent: Sep. 3, 2019

(54) NON-TRANSITORY COMPUTER READABLE RECORDING MEDIUM, ENCODING METHOD, CREATING METHOD, ENCODING DEVICE, AND DECODING DEVICE

(71) Applicant: FUJITSU LIMITED, Kawasaki-shi, Kanagawa (JP)

(72) Inventors: Masahiro Kataoka, Kamakura (JP); Yoshihide Tomiyama, Kobe (JP); Ryu Matsui, Kobe (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/191,899

(22) Filed: Nov. 15, 2018

(65) Prior Publication Data

US 2019/0207625 A1 Jul. 4, 2019

(30) Foreign Application Priority Data

Dec. 28, 2017 (JP) ................................. 2017-254256

(51) Int. Cl.
*H03M 7/30* (2006.01)
*G06F 17/27* (2006.01)

(52) U.S. Cl.
CPC ...... *H03M 7/3088* (2013.01); *G06F 17/2735* (2013.01)

(58) Field of Classification Search
CPC .......................... H03M 7/3088; G06F 17/2735
USPC ................................................... 341/51, 106
See application file for complete search history.

(56) References Cited

U.S. PATENT DOCUMENTS

| 5,872,530 A | 2/1999 | Domyo et al. |
| 6,985,965 B2* | 1/2006 | Hannu ................. H03M 7/30 709/247 |
| 2016/0217111 A1* | 7/2016 | Kataoka ............. G06F 17/2252 |
| 2016/0231942 A1 | 8/2016 | Koifman et al. |
| 2017/0288694 A1 | 10/2017 | Kataoka et al. |

FOREIGN PATENT DOCUMENTS

| EP | 0 729 237 A2 | 8/1996 |
| EP | 3 193 260 A2 | 7/2017 |
| JP | 9-214352 | 8/1997 |
| JP | 10-260980 | 9/1998 |
| JP | 2004-13680 | 1/2004 |
| JP | 2014-204357 | 10/2014 |

OTHER PUBLICATIONS

Adiego et al: "Using structural contexts to compress semistructured text collections", Information Processing & Managem, Elsevier, Barking, GB, vol. 43, No. 3, Jan. 27, 2007 (Jan. 27, 2007), pp. 769-790.
Inga Miller et al: "Adaptive String Dictionary Compression in In-Memory Column-Store Database Systems", Mar. 24, 2014 (Mar. 24, 2014).
Extended European Search Report issued May 22, 2019 in European Application No. 18207223.1.

\* cited by examiner

*Primary Examiner* — Khai M Nguyen
(74) *Attorney, Agent, or Firm* — XSensus LLP

(57) ABSTRACT

An information processing apparatus encodes text data by using a dynamic dictionary in which codes and words appearing multiple times are associated with the text data. A registration destination area, in the dynamic dictionary, of each of the codes registered in the dynamic dictionary at the encoding is associated with a position, in the text data, of each of the words associated with the codes.

9 Claims, 14 Drawing Sheets

NON-TRANSITORY COMPUTER READABLE RECORDING MEDIUM, ENCODING METHOD, CREATING METHOD, ENCODING DEVICE, AND DECODING DEVICE

CROSS-REFERENCE TO RELATED APPLICATION

This application is based upon and claims the benefit of priority of the prior Japanese Patent Application No. 2017-254256, filed on Dec. 28, 2017, the entire contents of which are incorporated herein by reference.

FIELD

The embodiments discussed herein are related to a computer-readable recording medium or the like.

BACKGROUND

In recent years, there is a technology for performing encoding in units of words at the time of encoding data. In encoding performed in units of words, unlike compression using ZIP, encoding is not performed on a plurality of consecutive words. Thus, by performing encoding in units of words, it is possible to reuses a part of encoding data extracted, without processing anything, in an encoded state.

Here, when performing encoding in units of words, encoding is performed by using a static dictionary and a dynamic dictionary. The static dictionary is information in which codes are associated with words that frequently appear. If a word targeted for encoding is not present in the static dictionary, encoding is performed by registering the subject word in the dynamic dictionary and allocating a dynamic code to the word. For example, dynamic codes are allocated in the order in which words appear.

Patent Document 1: Japanese Laid-open Patent Publication No. 2014-204357
Patent Document 2: Japanese Laid-open Patent Publication No. 09-214352
Patent Document 3: Japanese Laid-open Patent Publication No. 10-260980
Patent Document 4: Japanese Laid-open Patent Publication No. 2004-013680

SUMMARY

According to an aspect of an embodiment, an encoding method includes: reading text data; and encoding the text data by using a dynamic dictionary in which codes and words appearing multiple times are associated with the text data, wherein a registration destination area, in the dynamic dictionary, of each of the codes registered in the dynamic dictionary at the encoding is associated with a position, in the text data, of each of the words associated with the codes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

However, in the conventional technology described above, if a part of encoding data is extracted and reused after a transfer, there is a problem in that data in the dynamic dictionary is redundant.

The dynamic code to be allocated to a word when the dynamic dictionary is used is allocated in accordance with the appearance of words. Consequently, when a part of encoding data is extracted and reused, the entire dynamic dictionary is stored in a trailer portion in a compressed file, data that is not related to the part of extracted code is included in the dynamic dictionary, which is redundant.

Preferred embodiments of the present invention will be explained with reference to accompanying drawings. Furthermore, the present invention is not limited to the embodiments.

[a] First Embodiment

Figure 1:
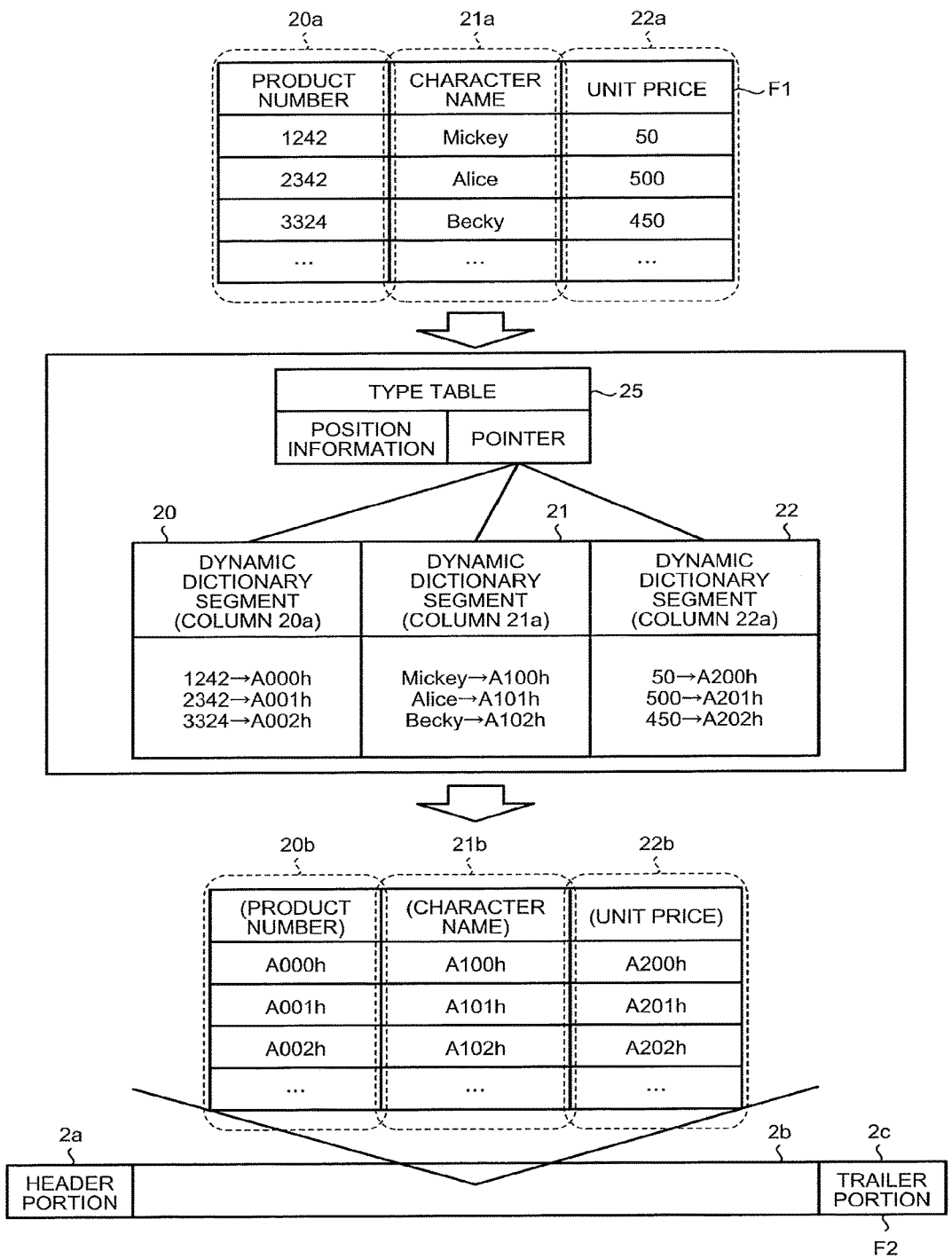
FIG. 1 is a diagram illustrating an example of an encoding process performed by an information processing apparatus according to a first embodiment.

FIG. 1 is a diagram illustrating an example of an encoding process performed by an information processing apparatus according to a first embodiment. The information processing apparatus is an example of an encoding device and a decoding device. The information processing apparatus reads a file F1 that is an encoding target and performs static code encoding based on a static dictionary or performs dynamic code encoding based on a dynamic dictionary, thereby creating an encoding file F2. The static dictionary is information in which static codes are associated with corresponding words that frequently appear.

The file F1 described in the embodiment is a file in which a plurality of words is separated by delimiters into a plurality of vertical lines (columns). In the example illustrated in FIG. 1, in the file F1, columns 20a, 21a, and 22a are included. In the column 20a, words related to "product number" of "1242", "2342", and "3324" are included. In the column 21a, words related to "character name" of "Mickey", "Alice", and "Becky" are included. In the column 22a, words related to "unit price" of "50", "500", and "450" are included.

The information processing apparatus reads a word from the file F1 and performs a process of replacing the word that hits in the static dictionary with a static code. It is assumed that the words included in the file F1 are separated by spaces. As an example, it is assumed that the words of "product number", "character name", and "unit price" included in the file F1 are words hit in the static dictionary. The information processing apparatus converts each of the words to a static code. Here, for convenience of description, the static codes associated with the words "product number", "character name", and "unit price" are referred to as "(product number)", "(character name)", and "(unit price)", respectively.

The information processing apparatus reads words from the file F1 and registers a word that does not hit in the static dictionary in an area that is associated with position information on the word in the dynamic dictionary that can be segmented into a plurality parts. In a description below, a case of using a plurality of dynamic dictionary segments will be described; however, it may also be possible to use a single dynamic dictionary segment or dynamic dictionary segments the number of which is smaller than the number of segments as long as the dynamic dictionary can be segmented into a plurality of areas.

In a case of using a plurality of dynamic dictionary segments, regarding the words that do not hit in the static dictionary, information processing apparatus judges the dynamic dictionary segment associated with the position information on the word based on the plurality of dynamic dictionary segments and performs dynamic code encoding by using the determined dynamic dictionary segment. The information processing apparatus registers the word in the dynamic dictionary segment that is associated with the position information on the word, allocates a dynamic code, and replaces the word with the dynamic code.

In the example illustrated in FIG. 1, a plurality of dynamic dictionary segments 20 to 22 is present, in the dynamic dictionary, at the position associated with each of the pieces of position information. FIG. 1 illustrates dynamic dictionary segments 20 to 22 associated with the columns 20a to 22a, respectively; however, dynamic dictionary segments associated with other position information may also be present. For example, the file F1 may also be divided into the column direction and the row direction and a dynamic dictionary associated with each of the areas may also be used.

The dynamic dictionary segment 20 is the segment of the dynamic dictionary used when the "words positioned in the column 20a" are subjected to dynamic code encoding. For example, the dynamic codes of "A000h to A0FFh" are allocated to the dynamic dictionary segment 20. The dynamic dictionary segment 21 is the segment of the dynamic dictionary used when the "words positioned in the column 21a" are subjected to dynamic code encoding. For example, the dynamic codes of "A100h to A1FFh" are allocated to the dynamic dictionary segment 21. The dynamic dictionary segment 22 is the segment of the dynamic dictionary used when the "words positioned in the column 22a" are subjected to dynamic code encoding. For example, the dynamic codes of "A200h to A2FFh" are allocated to the dynamic dictionary segment 22.

The information processing apparatus judges, by using a type table 25, the dynamic dictionary segment associated with the position information. The type table 25 associates the position information with a pointer. The pointer is information indicating a dynamic dictionary segment associated with the position information. For example, if the position information is the "word positioned in the column 20a", the pointer indicates the position in the dynamic dictionary segment 20. If the position information is the "word positioned in the column 21a", the pointer indicates the position of the dynamic dictionary 22. If the position information is the "word positioned in the column 22a", the pointer indicates the position in the dynamic dictionary segment 22.

It is assumed that each of the words "1242", "2342", "3324" positioned in the column 20a in the file F1 is the word that does not hit in the static dictionary. The information processing apparatus judges the dynamic dictionary segment 20 associated with the attribute information on the "word positioned in the column 20a" based on the dynamic dictionary segments 20 to 22. The information processing apparatus performs dynamic code encoding by allocating the dynamic codes "A000h", "A001h", and "A002h" to the words "1242", "2342", and "3324", respectively.

It is assumed that each of the words "Mickey", "Alice", and "Becky" positioned in the column 21a in the file F1 is the word that does not hit in the static dictionary. The information processing apparatus judges the dynamic dictionary segment 21 associated with the attribute information on the "word positioned in the column 21a" based on the dynamic dictionary segments 20 to 22. The information processing apparatus performs dynamic code encoding by allocating the dynamic codes "A100h", "A101h", and "A102h" to the words "Mickey", "Alice", and "Becky", respectively.

It is assumed that each of the words "50", "500", and "450" positioned in the column 22a in the file F1 is the word that does not hit in the static dictionary. The information processing apparatus judges the dynamic dictionary segment 22 associated with the attribute information on the "word positioned in the column 22a" based on the dynamic dictionary segments 20 to 22. The information processing apparatus performs dynamic code encoding by allocating the dynamic codes "A200h", "A201h", and "A202h" to the words "50", "500", and "450", respectively.

By performing the process described above, the information processing apparatus encodes the file F1 to the encoding file F2. In the encoding file F2, a header portion 2a, an encoding data portion 2b, and a trailer portion 2c are included. In the header portion 2a, information on the frequency of appearance of words or the like is included. In the encoding data portion 2b, encoding data created by the information processing apparatus is stored. In the trailer portion 2c, information on the dynamic dictionary segments 20 to 22 or the like is included.

Incidentally, regarding the encoding file F2, if the information processing apparatus receives an instruction of some codes that are extraction targets, the information processing apparatus creates an "extraction dynamic dictionary" in which an item of the dynamic dictionary segment is associated with the some codes that are the extraction targets.

The information processing apparatus decodes, by using the extraction dynamic dictionary, the some codes that are the extraction targets.

For example, the information processing apparatus assumes that, as the code that becomes the extraction target, each of the codes positioned in the column 20b of the encoding data has been designated. In this case, the information processing apparatus creates the dynamic dictionary segment 20 associated with the column 20b as an "extraction dynamic dictionary". The information processing apparatus decodes some codes stored in the encoding file F2 by comparing each of the codes positioned in the column 20b with the extraction dynamic dictionary (dynamic dictionary segment 20).

The information processing apparatus according to the first embodiment judges a dynamic dictionary segment associated with the position information on the words included in the file F1 and performs dynamic code encoding by using the judged dynamic dictionary segment. Consequently, the dynamic dictionary segment in which words and dynamic codes are associated can be separated by the position information on the words. Consequently, if decoding is performed on some codes, it is possible to create an extraction dynamic dictionary that includes only the information on the words associated with related codes, thereby preventing the data in the dynamic dictionary from being redundant.

Figure 2:
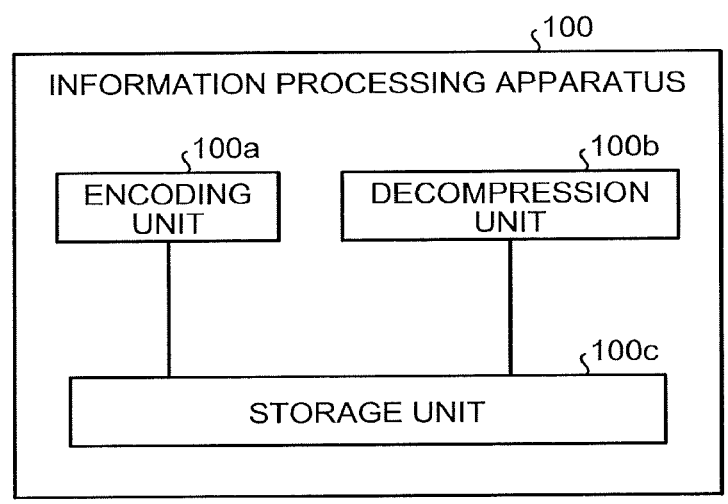
FIG. 2 is a functional block diagram illustrating a configuration of the information processing apparatus according to the first embodiment.

FIG. 2 is a functional block diagram illustrating a configuration of the information processing apparatus according to the first embodiment. As illustrated in FIG. 2, an information processing apparatus 100, an encoding unit 100a, a decompression unit 100b, and a storage unit 100c. The information processing apparatus 100 corresponds to the encoding device and the decoding device.

The encoding unit 100a is a processing unit that performs the encoding process illustrated in FIG. 1. The decompression unit 100b is a processing unit that decompresses (decoding) the encoding file by using the extraction dynamic dictionary described above. The storage unit 100c is a storage unit that stores therein the file F1 that is the encoding target, the encoding file F2 that is obtained from the encoding process, a decompression file F3 obtained by decompressing the encoding file F2, and the like. The storage unit 100c corresponds to a semiconductor memory device, such as a random access memory (RAM), a read only memory (ROM), and a flash memory, or a storage device, such as a hard disk drive (HDD).

Figure 3:
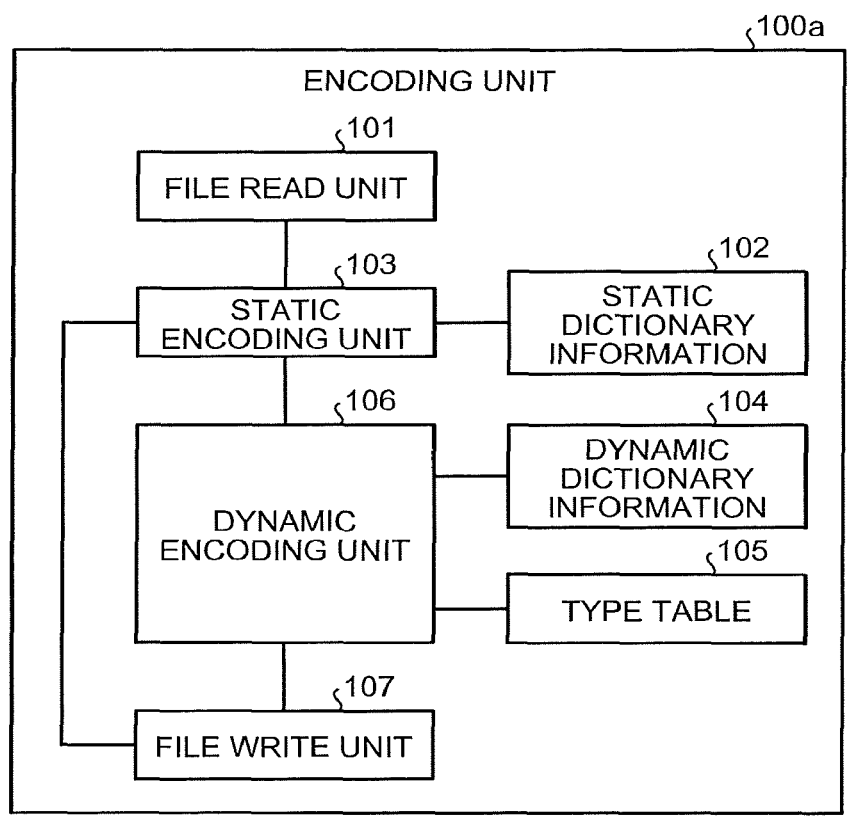
FIG. 3 is a diagram illustrating an example of a configuration of an encoding unit according to the first embodiment.

FIG. 3 is a diagram illustrating an example of a configuration of an encoding unit according to the first embodiment. As illustrated in FIG. 3, the encoding unit 100a includes a file read unit 101, a static dictionary information 102, and a static encoding unit 103. The encoding unit 100a includes dynamic dictionary information 104, a type table 105, a dynamic encoding unit 106, and a file write unit 107.

The file read unit 101 is a processing unit that reads data of the content portion in the file F1 that corresponds to the encoding target and that is stored in the storage unit 100c. The file read unit 101 outputs the read data to the static encoding unit 103.

Figure 4:
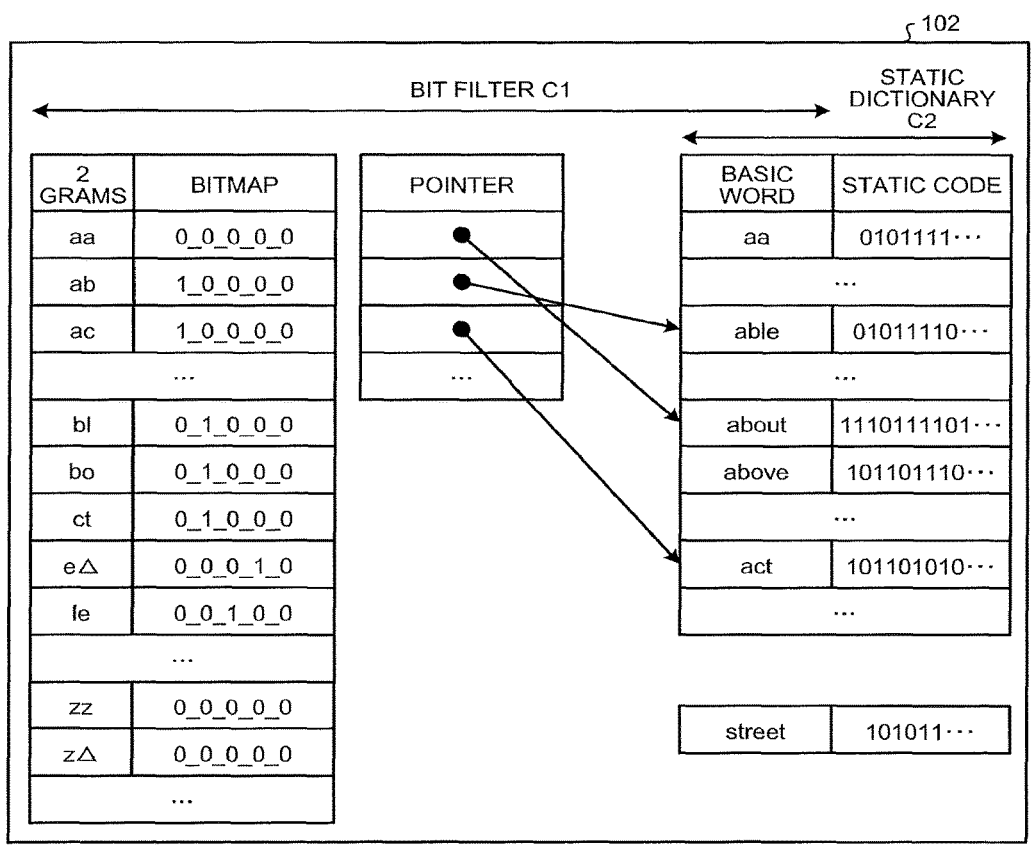
FIG. 4 is a diagram illustrating an example of a data structure of static dictionary information.

FIG. 4 is a diagram illustrating an example of a data structure of static dictionary information. The static dictionary information 102 has information on the static dictionary C2 in which static codes are defined to the words in each of which the frequency of appearance is equal to or greater than a threshold. As illustrated in FIG. 4, the static dictionary information 102 has 2 grams, bitmaps, pointers, basic words, and static codes. Among these, the 2 grams, the bitmaps, the pointers, and the basic words are associated with the bit filter C1. Furthermore, the basic words and the static codes are associated with the static dictionary C2.

The 2 grams is information that indicates a character string (or a word) with two characters. Each of the bit maps indicates a bit map associated with the character string of the 2 grams. For example, the bit map associated with "aa" is "0_0_0_0_0". Each of the pointers is a pointer that indicates the position of a basic word associated with a bitmap.

Each of the basic words is a high frequency word registered in, for example, the static dictionary C2. Each of the static codes is encoding data allocated to the basic word. Furthermore, in the static dictionary C2, in addition to the basic words and the static codes, information, such as the character string length, the frequency of appearance of word, may also be included.

The static encoding unit 103 is a processing unit that compares data of the content in the file F1 in the file read unit 101 with the bit filter C1 in the static dictionary information 102 and that replaces the word that hits in the bit filter C1 with the static code. The static encoding unit 103 outputs the static code associated with the word to the file write unit 107.

Here, a description will be given of an example of a process in which the static encoding unit 103 judges whether a word hits in the bit filter C1. For example, if a word is "ableΔ", the static encoding unit 103 makes combinations of the bitmaps that are associated with the 2 grams of "ab", "bl", "le", and "eΔ". In each of the digits of the bitmap, if the values of all of the bitmaps are set to 0, the static encoding unit 103 sets the corresponding digit of all of the combination bitmaps to "0". In contrast, if at least "1" is included, the static encoding unit 103 makes combinations of bitmaps by setting the subject digit to "1".

For example, it is assumed that the bitmap of "ab" is "1_0_0_0_0", the bitmap of "bl" is "0_1_0_0_0", the bitmap of "le" is "0_0_1_0_0", and the bitmap of "eΔ" is "0_0_0_1_0". In this case, the bitmap that is the combination of each of the bitmaps becomes "1_1_1_1_0".

The static encoding unit 103 compares the combined bitmaps with the pointers in the bit filter C1 and then specifies the basic word at the position indicated by the pointer that is associated with the bitmap. The static encoding unit 103 sequentially searches for the basic word associated with the word from the specified basic words. If a basic word that is the same as the word is present, the static encoding unit 103 judges that the word hits in the bit filter C1.

Figure 5:
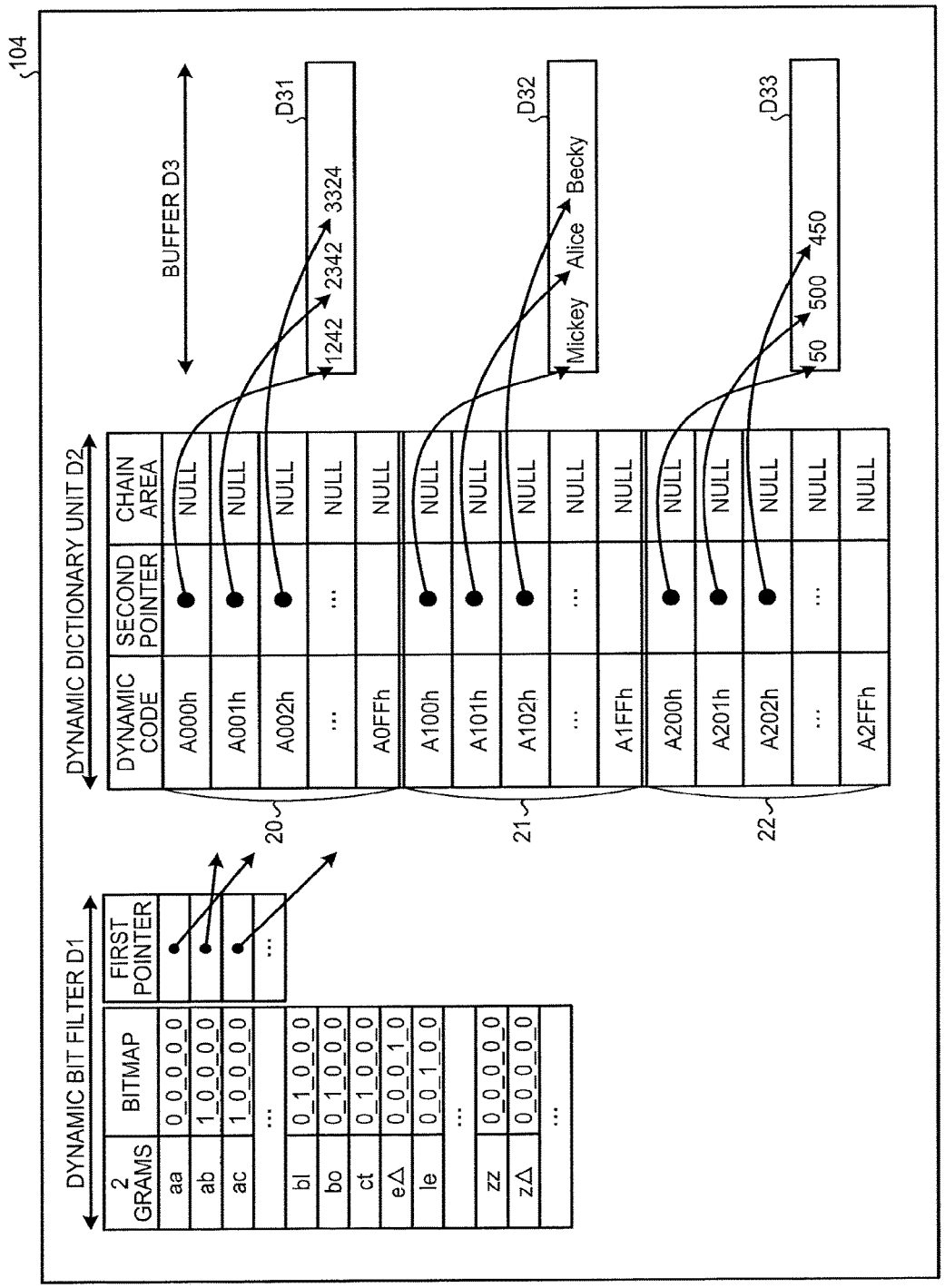
FIG. 5 is a diagram illustrating an example of a data structure of dynamic dictionary information.

FIG. 5 is a diagram illustrating an example of a data structure of dynamic dictionary information. The dynamic dictionary information 104 includes information related to the dynamic dictionary illustrated in FIG. 1. As illustrated in FIG. 5, the dynamic dictionary information 104 has a dynamic bit filter D1, a dynamic dictionary unit D2, and a buffer D3.

The dynamic bit filter D1 has 2 grams, bitmaps, and first pointers. The dynamic dictionary unit D2 has the dynamic dictionary segments 20 to 22. Each of the dynamic dictionary segments 20 to 22 associates dynamic codes, second pointers, and chain areas. The buffer D3 stores therein a word that has not been encoded by a dynamic code.

The 2 grams in the dynamic bit filter D1 is information indicating character string having two characters (or two words). Each of the bitmaps indicates a bitmap associated with 2-gram character string. For example, the bitmap associated with "aa" is "0_0_0_0_0". Each of the first pointers is a pointer indicating the position of the dynamic code associated with the bitmap. Other explanations related to the bitmaps and the first pointers are the same as the explanations related to the bitmaps and the pointers illustrated in FIG. 4.

The dynamic codes in the dynamic dictionary unit D2 are the codes allocated to the words stored in the buffer D3. The second pointers are information indicating the position in the buffer D3 in which the words associated with the dynamics code are stored. For example, the second pointer associated with the dynamic code "A100h" indicates the top position of "Mickey" stored in the buffer D32. Namely, this indicates that the word "Mickey" has been subjected to dynamic code encoding to the dynamic code "A100h".

The chain areas in the dynamic dictionary unit D2 is information indicating whether the corresponding character string or the like is chained from the pointer stored in the bit filter. If the corresponding character string or the like is not chained, "NULL" is set in the chain area.

Figure 6:
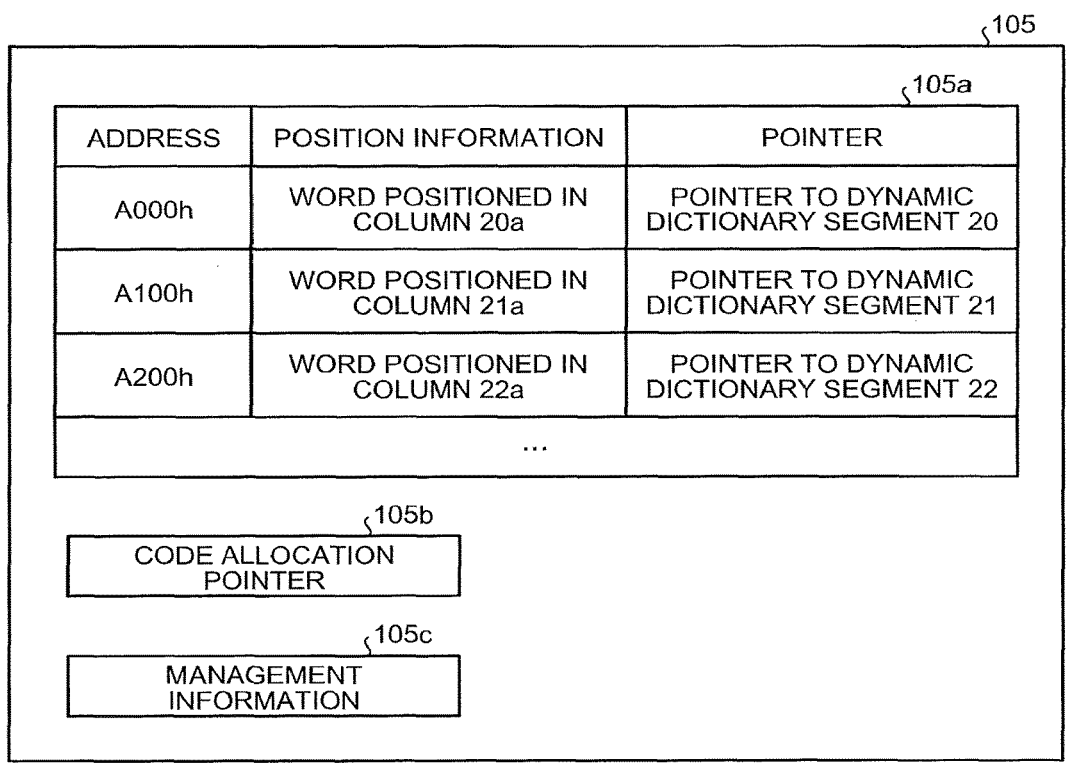
FIG. 6 is a diagram illustrating an example of a data structure of a type table.

FIG. 6 is a diagram illustrating an example of a data structure of a type table. As illustrated in FIG. 6, the type table 105 has a table 105a, a code allocation pointer 105b, and management information 105c. The table 105a associates the addresses, the position information, and the pointers. Each of the addresses indicates the address that has been allocated to the dynamic dictionary segment associated with the subject attribute information. The position information indicates the column in which the above described word is positioned. Each of the pointers indicates the position of the dynamic dictionary segment associated with the position information.

The code allocation pointer 105b is the pointer indicating, regarding each of the dynamic dictionary segments, an unused dynamic code positioned at the top from among the dynamic codes allocated to the dynamic dictionary segment. For example, the dynamic dictionary segment 21 illustrated in FIG. 5 will be described. It is assumed that, in the dynamic dictionary segment 21, dynamic codes "A100h to A1FFh" are allocated and, among these dynamic codes, dynamic codes "A100h", "A101h", and "A102h" are allocated to the dynamic codes "Mickey", "Alice", and "Becky", respectively. In this case, in the code allocation pointer 105b, the dynamic code "A103h" is set. Similarly to the other dynamic dictionary segments, from among the dynamic codes allocated to the dynamic dictionary segment, the pointer indicating the top position of the unused dynamic code is set.

The management information 105c is information that manages, regarding each of the dynamic dictionary segments, the remaining number of words to be allocated to the dynamic dictionary segment. In the example described in the first embodiment, it is assumed that a maximum of "256" words are registered in each of the dynamic dictionary segments. Furthermore, the management information 105c has information on the pointer that indicates the position of the dynamic code that has not been allocated to the dynamic dictionary (unused position).

A description will be given here by referring back to FIG. 3. The dynamic encoding unit 106 is a processing unit that assigns a dynamic code to the word to which a static code has not been allocated by the static encoding unit 103 and that performs dynamic code encoding. The dynamic encoding unit 106 outputs a dynamic code associated with a word to the file write unit 107. In a description below, an example of a process performed by the dynamic encoding unit 106 will be described.

First, a description will be given of a case in which the dynamic encoding unit 106 performs dynamic code encoding on the word that is not registered in the dynamic dictionary information 104. When the dynamic encoding unit 106 acquires a word from the static encoding unit 103, the dynamic encoding unit 106 compares the position information on the word with the type table 105 and judges the position in the dynamic dictionary segment associated with the position information on the word. The dynamic encoding unit 106 allocates, from among the dynamic codes assigned to the judged dynamic dictionary segment, the top dynamic code that has not been allocated to another word to the word. Furthermore, the dynamic encoding unit 106 stores the word in the buffer D3 and sets the second pointer to the position in which the word has been stored. Furthermore, the dynamic encoding unit 106 updates the first pointer stored in the dynamic bit filter D1 by setting the first pointer to the position of the dynamic code that is associated with the word.

For example, a description will be given of a case in which the dynamic encoding unit 106 performs dynamic code encoding on the word "Mickey" that is not registered in the dynamic dictionary information 104. The dynamic encoding unit 106 compares the position information on the "word positioned in the column 21a" related to the word "Mickey" with the type table 105 illustrated in FIG. 6 and judges the position in the dynamic dictionary segment 21 that is associated with the position information indicating the "word positioned in the column 21a".

The dynamic encoding unit 106 allocates, from among the dynamic codes "A100h to A1FFh" allocated to the dynamic dictionary segment 21, the top dynamic code, to which another word has not been allocated, to the word "Mickey". In the example illustrated in FIG. 5, the dynamic encoding unit 106 allocates the dynamic code "A100h" to the word "Mickey". The dynamic encoding unit 106 stores the word "Mickey" in the buffer D32 and then designates the second pointer associated with the dynamic code "A100h" at the position in which the word "Mickey" has been stored. Furthermore, the dynamic encoding unit 106 updates the dynamic bit filter D1. The dynamic encoding unit 106 outputs, to the file write unit 107, the dynamic code "A100h" allocated to the word "Mickey".

In the following, a description will be given of a case in which the dynamic encoding unit 106 performs dynamic code encoding on the word registered in the dynamic dictionary information 104. For example, by performing the process described below, the dynamic encoding unit 106 judges whether the word targeted for dynamic code encoding is registered in the dynamic dictionary information 104. The dynamic encoding unit 106 compares a word targeted for dynamic code encoding with the dynamic bit filter D1 and specifies the position in the dynamic dictionary unit D2 indicated by the first pointer. If the same word as the word targeted for dynamic code encoding is stored at the position in the buffer D3 indicated by the second pointer that corresponds to the specified position, the dynamic encoding unit 106 judges whether the word targeted for dynamic code encoding has been registered in the dynamic dictionary information 104. In contrast, if the same word as the word targeted for dynamic code encoding is not stored, the dynamic encoding unit 106 performs the process described above because the word targeted for dynamic code encoding is not registered.

For example, a description will be given of a case in which the dynamic encoding unit 106 performs dynamic code encoding on the word "Mickey" registered in the dynamic dictionary information 104. When the dynamic encoding unit 106 compares the word "Mickey" with the dynamic bit filter D1 and refers to the position in the buffer D3 indicated by the second pointer associated with the dynamic code "A100h", "Mickey" is stored and the words are matched. Thus, the dynamic encoding unit 106 outputs the dynamic code "A100h" allocated to "Mickey" to the file write unit 107.

The file write unit 107 is a processing unit that acquires static codes and dynamic codes associated with words and that writes the acquired static codes and the dynamic codes to the encoding data portion 2b in the encoding file F2. When the file write unit 107 writes a static code and a dynamic code to the encoding data portion 2b, the file write unit 107 associates the static code and the dynamic code with the positions of the words that are associated with the dynamic code and the static code.

For example, the file write unit 107 stores the code, which is associated with each of the words in the first column (the column 20a) in the file F1, in the first column (the column 20b) in the encoding data. The file write unit 107 stores the code, which is associated with each of the words in the second column (the column 21a) in the file F1, in the second column (the column 21b) in the encoding data. The file write unit 107 stores the code, which is associated with each of the words in the third column (the column 22a) in the file F1, in the third column (the column 22b) in the encoding data.

Furthermore, the file write unit 107 stores information on the frequency of appearance of words in the header portion 2a. The file write unit 107 stores the dynamic dictionary information 104 or the like in the trailer portion 2c.

Figure 7:
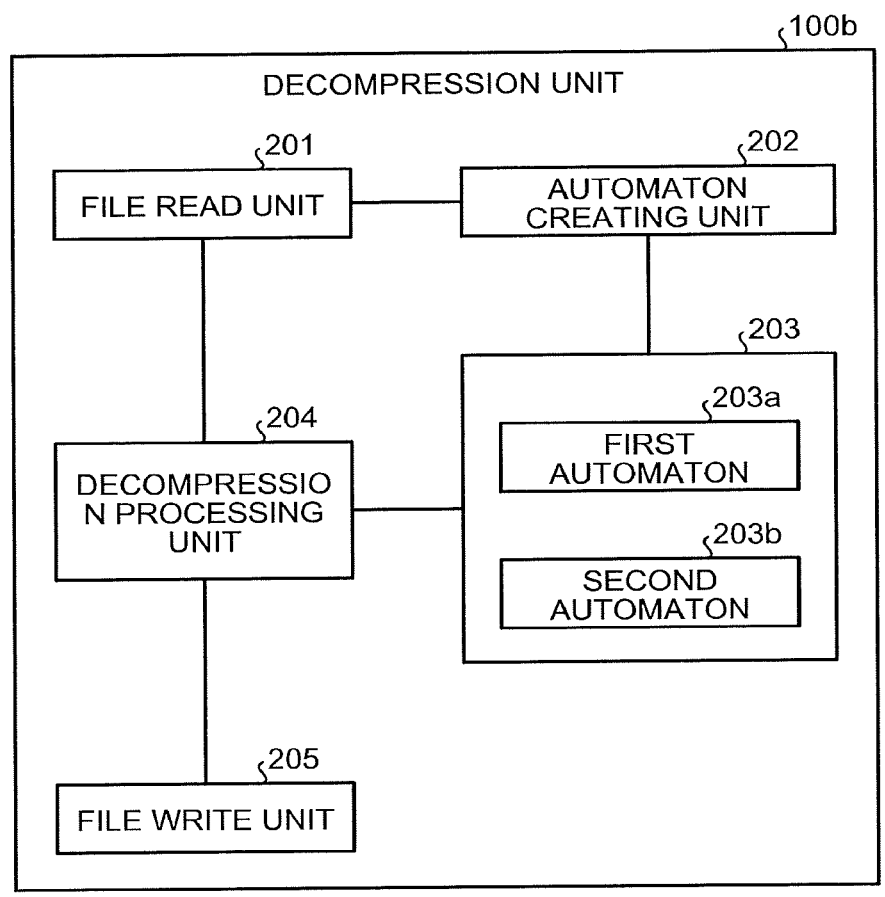
FIG. 7 is a functional block diagram illustrating an example of a configuration of a decompression unit according to the first embodiment.

FIG. 7 is a functional block diagram illustrating an example of a configuration of the decompression unit according to the first embodiment. As illustrated in FIG. 7, the decompression unit 100b includes a file read unit 201, an automaton creating unit 202, a decompression processing unit 204, and a file write unit 205. Furthermore, the decompression unit 100b includes, for example, a first automaton 203a and a second automaton 203b.

The file read unit 201 is a processing unit that reads the code stored in the encoding data portion 2b in the encoding file F2. The file read unit 201 is an example of a reception unit. For example, if a code that becomes the extraction target is designated by an input unit (not illustrated), the file read unit 201 reads the code that becomes the extraction target and outputs the code to the decompression processing unit 204.

The file read unit 201 reads the information on the frequency of appearance of words stored in the header portion 2a and outputs the read information to the automaton creating unit 202. The file read unit 201 reads the dynamic dictionary information 104 stored in the trailer portion 2c and outputs the read information to the automaton creating unit 202. Furthermore, the file read unit 201 outputs the information on the position of the code that becomes the extraction target to the automaton creating unit 202. The information on the position of the code that becomes the extraction target is information indicating that, for example, the position of the code is positioned at which position, i.e., one of the columns 20b to 22b, illustrated in FIG. 1.

The automaton creating unit 202 creates, based on the information on the frequency of appearance of words, the first automaton 203a that converts a static code to a word. Furthermore, based on the dynamic dictionary information 104 and the position of the code that becomes the extraction target, the automaton creating unit 202 extracts the dynamic dictionary associated with the position of the code that becomes the extraction target from the dynamic dictionary information 104. The dynamic dictionary extracted by the automaton creating unit 202 is referred to as an extraction dynamic dictionary. The automaton creating unit 202 creates the second automaton 203b that converts the dynamic code to the word based on the relationship between the dynamic code and the word that are set in the extraction dynamic dictionary.

For example, if the position of the code that becomes the extraction target is included in the column 20b in the encoding data, the automaton creating unit 202 extracts the dynamic dictionary segment 20 as an extraction dynamic dictionary. If the position of the code that becomes the extraction target is included in the column 21b in the encoding data, the automaton creating unit 202 extracts the dynamic dictionary segment 21 as the extraction dynamic dictionary. If the position of the code that becomes the extraction target is included in the column 22b in the encoding data, an automaton creating unit 203 extracts the dynamic dictionary segment 22 as the extraction dynamic dictionary.

The first automaton 203a is an automaton that associates a static code with a word (high frequency word). For example, if the first four bits in a code are included in "0h (0000) to 9h (1001)", a word is specified by comparing the first automaton 203a with the code.

The second automaton 203b is an automaton that associates the dynamic code in the extraction dynamic dictionary with a word (low frequency word). The second automaton 203b is created by being associated with the extraction dynamic dictionary.

The decompression processing unit 204 is a processing unit that specifies a word associated with a code based on the code acquired from the file read unit 201 and based on the first automaton 203a or the second automaton 203b. For example, if the first four bits in a code is included in "0h (0000) to 9h (1001)", the decompression processing unit 204 specifies the word (high frequency word) associated with the code by comparing the first automaton 203a with the code.

Regarding the code that does not hit in the first automaton 203a, the decompression processing unit 204 specifies a word (low frequency word) by comparing the second automaton 203b with the code.

By repeatedly performing the process described above on the codes read from the file read unit 201, the decompression processing unit 204 sequentially specifies words associated with codes and outputs the specified words to the file write unit 205.

The file write unit 205 is a processing unit that stores decoded words acquired from the decompression processing unit 204 in the decompression file F3.

Figure 8:
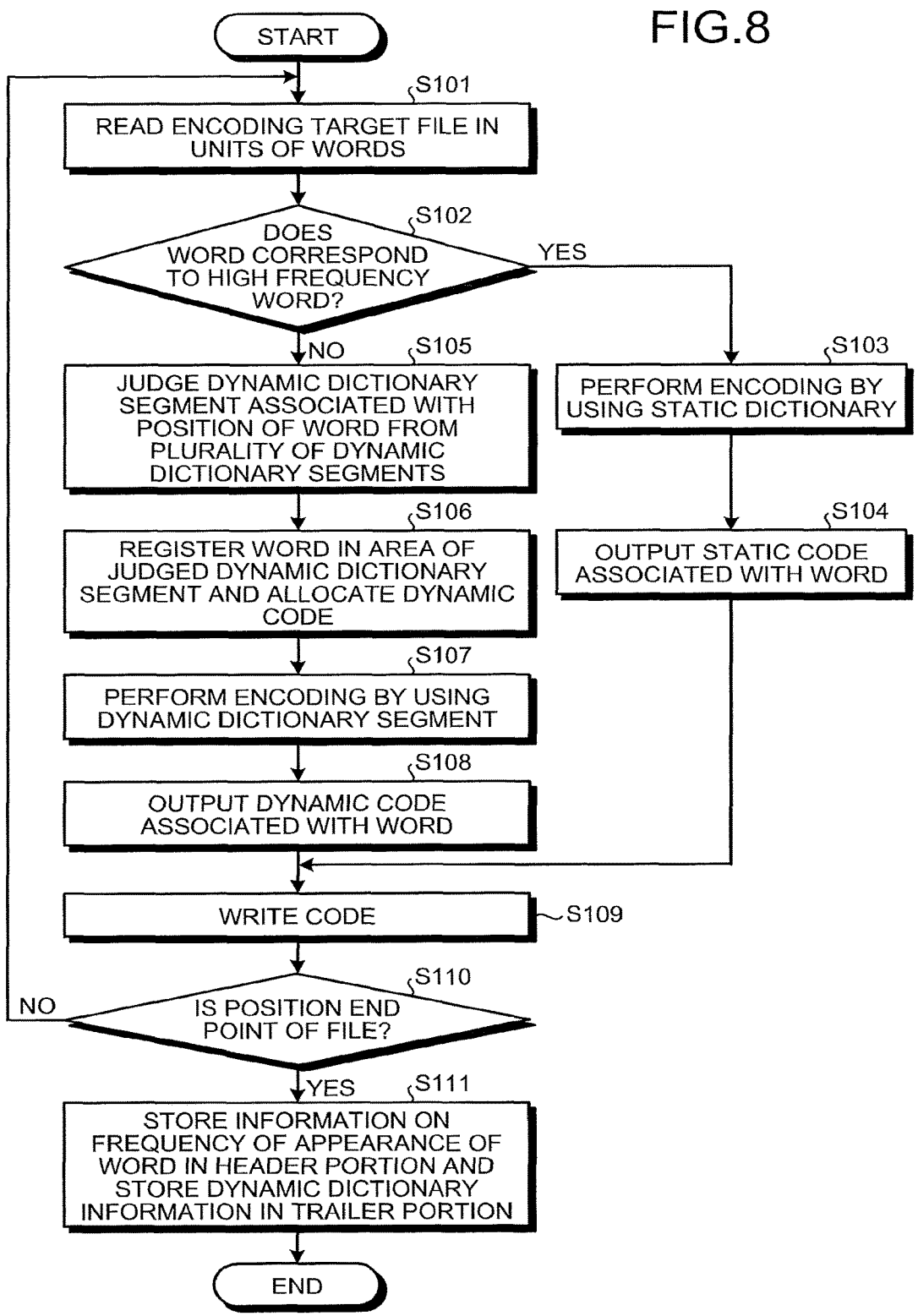
FIG. 8 is a flowchart illustrating the flow a process performed by an encoding unit according to the first embodiment.

In the following, the flow of a process performed by the encoding unit 100a according to the first embodiment will be described. FIG. 8 is a flowchart illustrating the flow a process performed by an encoding unit according to the first embodiment. As illustrated in FIG. 8, the file read unit 101 in the encoding unit 100a reads, in units of words, the file F1 that is the encoding target (Step S101).

The static encoding unit 103 in the encoding unit 100a judges whether the word is a high frequency word (Step S102). For example, at Step S102, if the word hits in the static dictionary C2, the static encoding unit 103 judges that the word is a high frequency word.

If the word is a high frequency word (Yes at Step S102), the static encoding unit 103 performs encoding by using the static dictionary C2 (Step S103). The static encoding unit 103 outputs the static code associated with the word to the file write unit 107 (Step S104) and moves to Step S109. In contrast, if the word is not a high frequency word (No at Step S102), the static encoding unit 103 moves to Step S105.

The dynamic encoding unit 106 in the encoding unit 100a judges, based on the type table 105, the dynamic dictionary segment associated with the position of the word from a plurality of dynamic dictionary segments (Step S105). The dynamic encoding unit 106 registers the word in the area of the judged dynamic dictionary segment and allocates a dynamic code (Step S106). The dynamic encoding unit 106 performs encoding by using the dynamic dictionary segment (Step S107) and outputs the dynamic code associated with the word to the file write unit 107 (Step S108).

The file write unit 107 writes the code (static code or dynamic code) to the encoding data portion 2b in the encoding file F2 (Step S109). The encoding unit 100a judges whether the position is the end point of the file F1 (Step S110). If the position is not the end point of the file F1 (No at Step S110), the encoding unit 100a moves to Step S101.

If the position is the end point of the file F1 (Yes at Step S110), the file write unit 107 stores the information on the frequency of appearance of the word in the header portion 2a in the encoding file F2 and stores the dynamic dictionary information 104 in the trailer portion 2c (Step S111).

Figure 9:
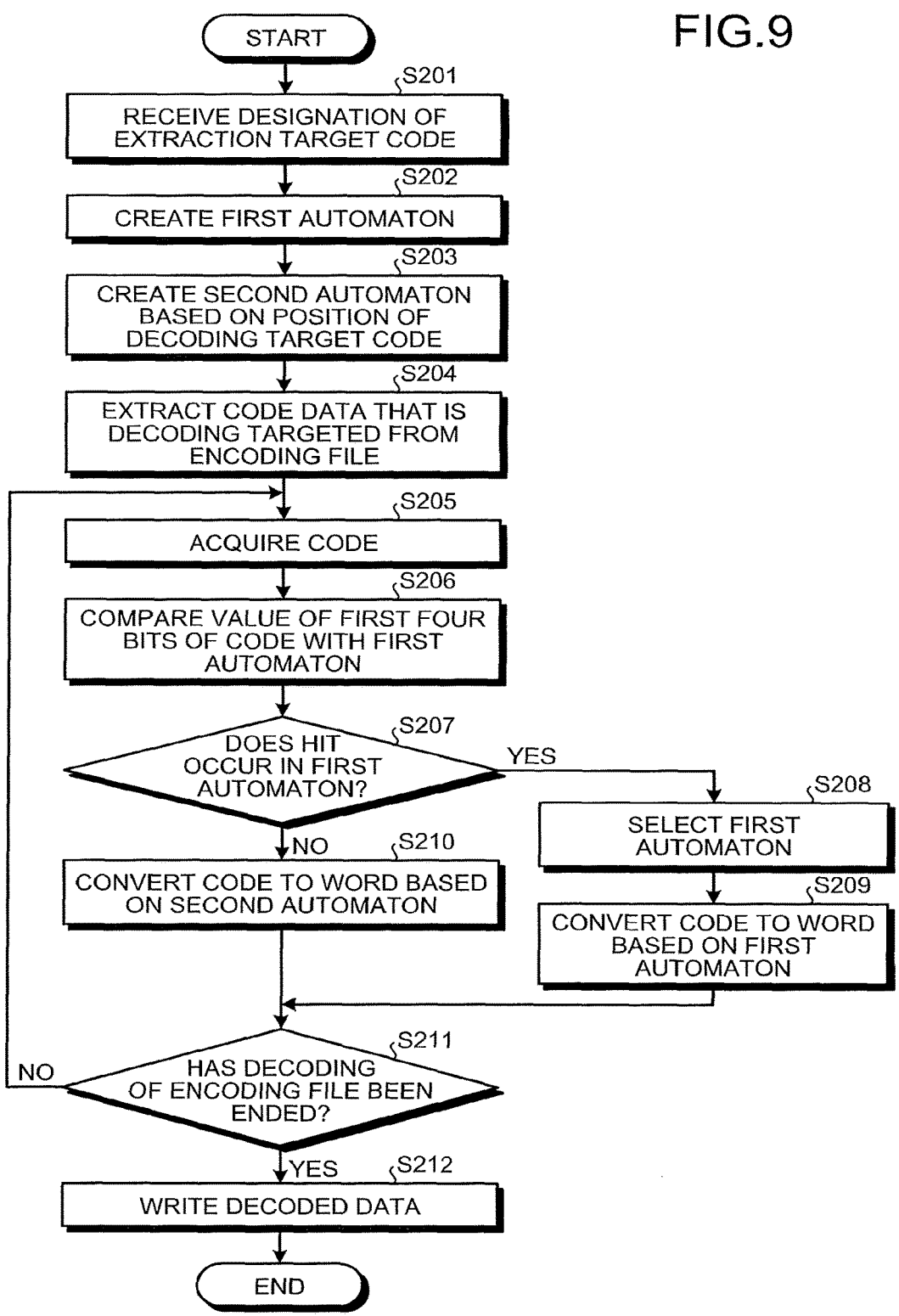
FIG. 9 is a flowchart illustrating the flow a process performed by the decompression unit according to the first embodiment.

In the following, the flow of a process performed by the decompression unit 100b according to the first embodiment will be described. FIG. 9 is a flowchart illustrating the flow a process performed by the decompression unit according to the first embodiment. As illustrated in FIG. 9, the file read unit 201 in the decompression unit 100b receives the designation of the code that is the extraction target (Step S201).

The automaton creating unit 202 in the decompression unit 100b creates the first automaton 203a (Step S202). The automaton creating unit 202 creates the second automaton 203b based on the position of the code that is targeted for decoding (Step S203).

The file read unit 201 extracts the code data targeted for decoding from the encoding file F2 (Step S204). The decompression processing unit 204 in the decompression unit 100b acquires a code from the file read unit 201 (Step S205). The decompression processing unit 204 compares the value of the first four bits of the code with the first automaton 203a (Step S206). If a hit occurs in the first automaton 203a (Yes at Step S207), the decompression processing unit 204 selects the first automaton 203a (Step S208). The decompression processing unit 204 converts the code to a word based on the first automaton 203a (Step S209) and moves to Step S211.

In contrast, if a hit does not occur in the first automaton 203a (No at Step S207), the decompression processing unit 204 converts the code to a word based on the second automaton 203b (Step S210).

The decompression processing unit 204 judges whether decoding of the encoding file F2 has been ended (Step S211). If decoding of the encoding file F2 has not been ended (No at Step S211), the decompression processing unit 204 moves to Step S205.

If decoding of the encoding file F2 has been ended (Yes at Step S211), the decompression processing unit 204 writes the decoded data to the decompression file F3 (Step S212).

In the following, effects of the information processing apparatus 100 according to the first embodiment will be described. The encoding unit 100a judges the dynamic dictionary segment associated with the position information on the word included in the file F1 and performs dynamic code encoding by using the judged dynamic dictionary segment. Consequently, because the dynamic dictionary segments in each of which words are associated with corresponding dynamic codes can be distinguished by the position information on the words, it is possible to efficiently use the dynamic dictionary.

For example, because the words associated with the corresponding dynamic codes is separately registered in each of the dynamic dictionary segments based on the position information on words/codes, if the code that becomes the extraction target is designated, the information processing apparatus 100 extracts the dynamic dictionary segment (extraction dynamic dictionary) associated with the code that becomes the extraction target from the dynamic dictionary information 104. Because the extraction dynamic dictionary has only the data related to the codes, it is possible to prevent the data in the extraction dynamic dictionary from being redundant. Furthermore, when performing decoding, it is possible to efficiently decoding by using an automaton associated with the extraction dynamic dictionary that is associated with the position of the code that corresponds to the extraction target.

[b] Second Embodiment

Figure 10:
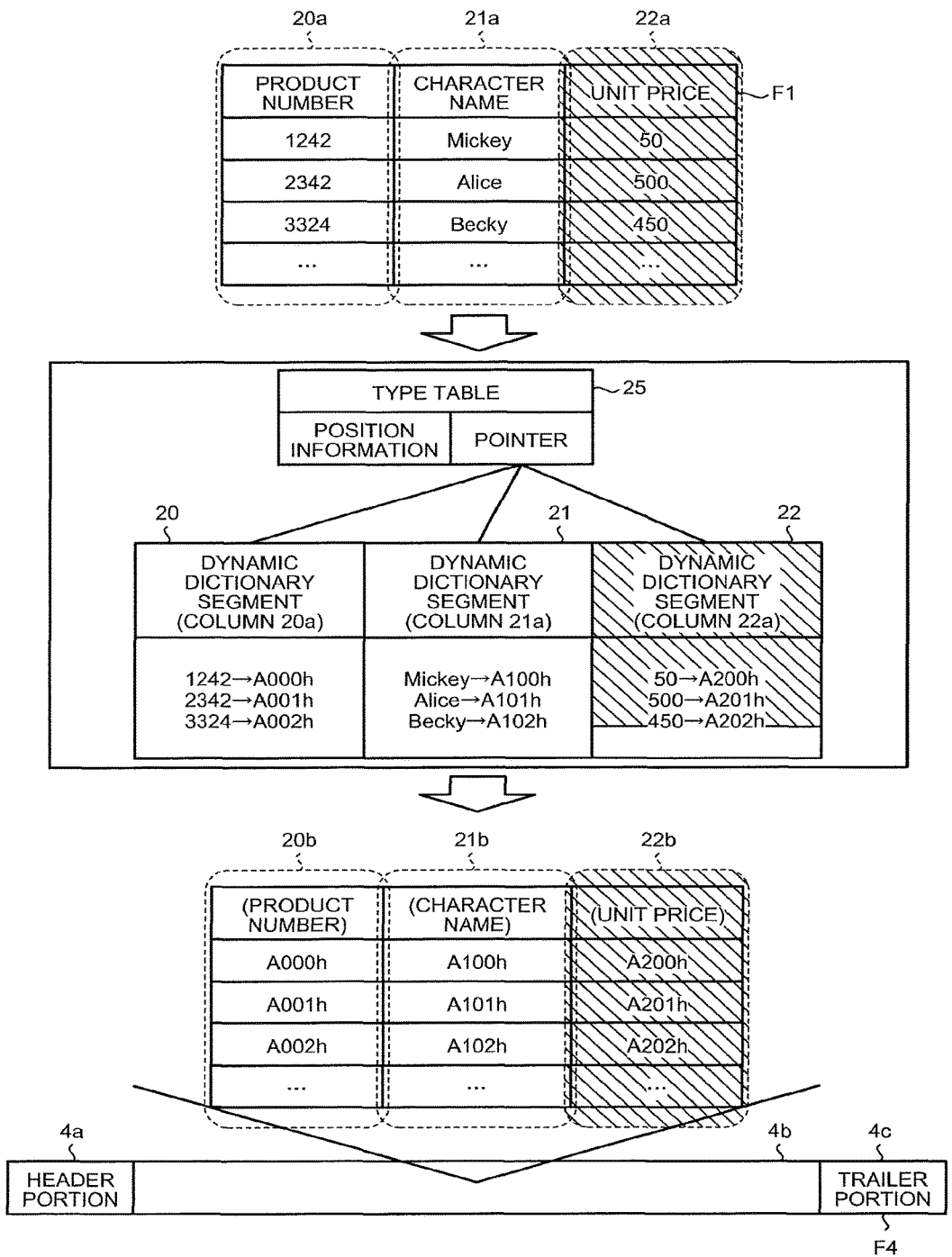
FIG. 10 is a diagram illustrating an example of an extraction process performed by an information processing apparatus according to a second embodiment.

FIG. 10 is a diagram illustrating an example of an extraction process performed by an information processing apparatus according to a second embodiment. The information processing apparatus reads the file F1 corresponding to the encoding target, extracts information stored in a part of column, and perform dynamic code encoding by using the dynamic dictionary. For example, as will be described later, in the second embodiment, from among the pieces of information included in the file F1, the columns 20a and 21a are extracted, dynamic code encoding is performed, and encoding file F4 is obtained.

The file F1 described in the second embodiment is a file in which a plurality of words is separated by delimiters into a plurality of vertical lines (columns). In the example illustrated in FIG. 10, the columns 20a, 21a, and 22a are included in the file F1. In the column 20a, words related to "product number" of "1242", "2342", and "3324". In the column 21a, words related to "character name" of "Mickey", "Alice", and "Becky" are included. In the column 22a, words related to "unit price" of "50", "500", and "450" are included.

The information processing apparatus reads the information that becomes the extraction target from the file F1 and performs, regarding the word that hits in the static dictionary, a process of replacing the word with a static code. In contrast, the information processing apparatus performs dynamic code encoding on the word that does not hit in the static dictionary by using the dynamic dictionary. The information processing apparatus registers the words in a plurality of dynamic dictionary segments that are stored in the dynamic dictionary and that are associated with the position information on the words, assigns dynamic codes, and replaces the word with the dynamic codes.

As an example, it is assumed that each of the words "product number", "character name", and "unit price" included in the file F1 is a word that hits in the static dictionary. The information processing apparatus converts each of the words that hit in the static dictionary to a static code. Here, for convenience of description, the static codes associated with the words "product number", "character name", and "unit price" are referred to as "(product number)", "(character name)", and "(unit price)".

In the example illustrated in FIG. 10, the dynamic dictionary segments 20 to 22 associated with each of the pieces of position information are present. FIG. 10 illustrates the dynamic dictionary segments 20 to 22 associated with the columns 20a to 22a, respectively; however, dynamic dictionary segments associated with other position information may also be present. For example, the file F1 may also be divided into the column direction and the row direction and a dynamic dictionary associated with each of the areas may also be used. Descriptions related to the dynamic dictionary segments 20 to 22 are the same as those related to the dynamic dictionary segments 20 to 22 illustrated in FIG. 1; therefore, the descriptions will be omitted.

The information processing apparatus judges, by using the type table 25, the dynamic dictionary segment associated with the position information. The type table 25 associates the position information with a pointer. The pointer is information indicating the dynamic dictionary segment associated with the position information. For example, if the position information is the "word positioned in the column 20a", the pointer indicates the position in the dynamic dictionary segment 20. If the position information is the "word positioned in the column 21a", the pointer indicates the position in the dynamic dictionary segment 21. If the position information is the "word positioned in the column 22a", the pointer indicates the position in the dynamic dictionary segment 22. Furthermore, in the description of FIG. 10, because the word positioned in the column 22a is excluded from the extraction target, the dynamic dictionary segment 22 is not used.

It is assumed that each of the words "1242", "2342", and "3324" positioned in the column 20a in the file F1 is a word that does not hit in the static dictionary. The information processing apparatus judges, based on the dynamic dictionary segments 20 to 22, the dynamic dictionary segment 20 associated with the attribute information on the "word positioned in the column 20a". The information processing apparatus performs dynamic code encoding by allocating the words "1242", "2342", and "3324" to the dynamic codes "A000h", "A001h", and "A002h", respectively. The information in the column 20a extracted from the file F1 is converted to the encoding data 20b.

It is assumed that each of the words "Mickey", "Alice", and "Becky" positioned in the column 21a in the file F1 is a word that does not hit in the static dictionary. The information processing apparatus judges, based on the dynamic dictionary segments 20 to 22, the dynamic dictionary segment 21 associated with the attribute information on the "word positioned in the column 21a". The information processing apparatus performs dynamic code encoding by allocating the words "Mickey", "Alice", and "Becky" to the dynamic codes "A100h", "A101h", and "A102h", respectively. The information stored in the column 21a extracted from the file F1 is converted to the encoding data 21b.

By performing the process described above, the information processing apparatus encodes the file F1 to the encoding file F4. In the encoding file F4, a header portion 4a, an encoding data portion 4b, and a trailer portion 4c are included. In the header portion 4a, information on the frequency of appearance of word or the like is included. In the encoding data portion 4b, the encoding data 20b and 21b created by the information processing apparatus are stored. In the trailer portion 4c, information on the dynamic dictionary segments 20 and 21 and the like is included.

The information processing apparatus according to the second embodiment creates the encoding file F4 by extracting, from among the pieces of information included in the file F1, a word in the column that becomes the extraction target and performing dynamic code encoding by using the dynamic dictionary segments associated with the position information. Consequently, the information processing apparatus can notify the transmission destination of only the information on the column that is needed for the transmission destination of the encoding file F4. For example, if a server at the transmission destination previously holds information on the unit price associated with a product number, even if information on the unit price included in the column 22a is not notified to the server, when only the information on the product number is notified, the unit price associated with the notified product number can be judged on the server side Furthermore, because the encoding data of the column other than the extraction target and the dynamic dictionary segment a column other than the extraction target is decoded are not stored in the encoding file F4, it is possible to reduce an amount of data in the encoding file F4.

Figure 11:
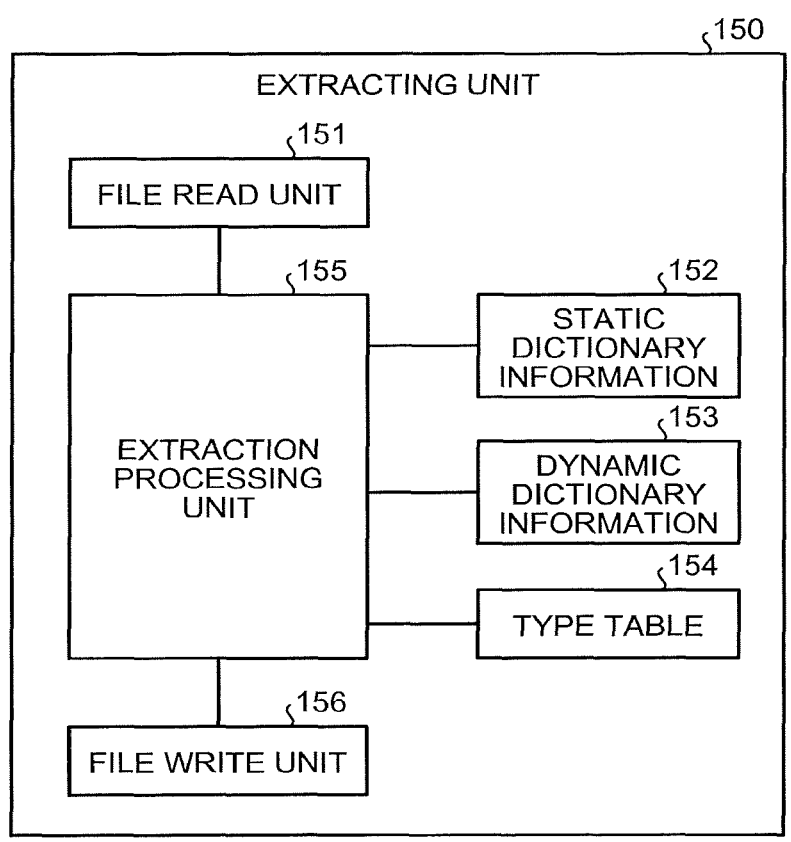
FIG. 11 is a diagram illustrating an example of a configuration of an extracting unit according to the second embodiment.

FIG. 11 is a diagram illustrating an example of a configuration of an extracting unit according to the second embodiment. As an example, it is assumed that an extracting unit 150 is included in the information processing apparatus 100 illustrated in FIG. 2. As illustrated in FIG. 11, the extracting unit 150 includes a file read unit 151, static dictionary information 152, dynamic dictionary information 153, a type table 154, an extraction processing unit 155, and a file write unit 156.

The file read unit 151 is a processing unit that reads data related to the content portion that is stored in the file F1 and that becomes the encoding target stored in the storage unit 100c. The file read unit 101 outputs the read data to the extraction processing unit 155.

Descriptions related to the static dictionary information 152, the dynamic dictionary information 153, and the type table 154 are the same as those related to the static dictionary information 102, the dynamic dictionary information 104, and the type table 105 described in the first embodiment; therefore, the descriptions will be omitted.

The extraction processing unit 155 extracts, from among the pieces of data related to the content portion in the file F1, each of the words in the column that becomes the extraction target and performs encoding. The information (column) that becomes the extraction target may also be previously set in the extraction processing unit 155 or information notified from an external device may also be used. The extraction processing unit 155 performs static code encoding on the word that hits in the static dictionary information 152 from among the words that become the extraction target. The process of static code encoding performed by the extraction processing unit 155 is the same as static code encoding performed by the static encoding unit 103 described in the first embodiment.

From among each of the words that become the extraction target, the extraction processing unit 155 performs dynamic code encoding based on the position information on the word that does not hit in static dictionary information 152. The process of dynamic code encoding performed by the extraction processing unit 155 is the same as the process performed by the dynamic encoding unit 106 described in the first embodiment. However, dynamic code encoding performed by the extraction processing unit 155 is not performed on the words that are other than the extraction target.

The extraction processing unit 155 outputs, to the file write unit 156, the encoding result (static codes and dynamic codes) of each of the words in the column that becomes the extraction target.

The file write unit 156 is a processing unit that acquires the static codes and the dynamic codes associated with the words and that writes the acquired static codes and the dynamic codes to the encoding data portion 4b in the encoding file F4. When the file write unit 156 writes the static codes and the dynamic codes to the encoding data portion 4b, the file write unit 156 associates the dynamic codes and the static code with the position of the words associated with the dynamic codes and the static code.

Furthermore, the file write unit 156 stores the information on the frequency of appearance of word in the header portion 4a. The file write unit 156 stores, in the trailer portion 4c, the information on the dynamic dictionary used when the word that becomes the extraction target is encoded.

Figure 12:
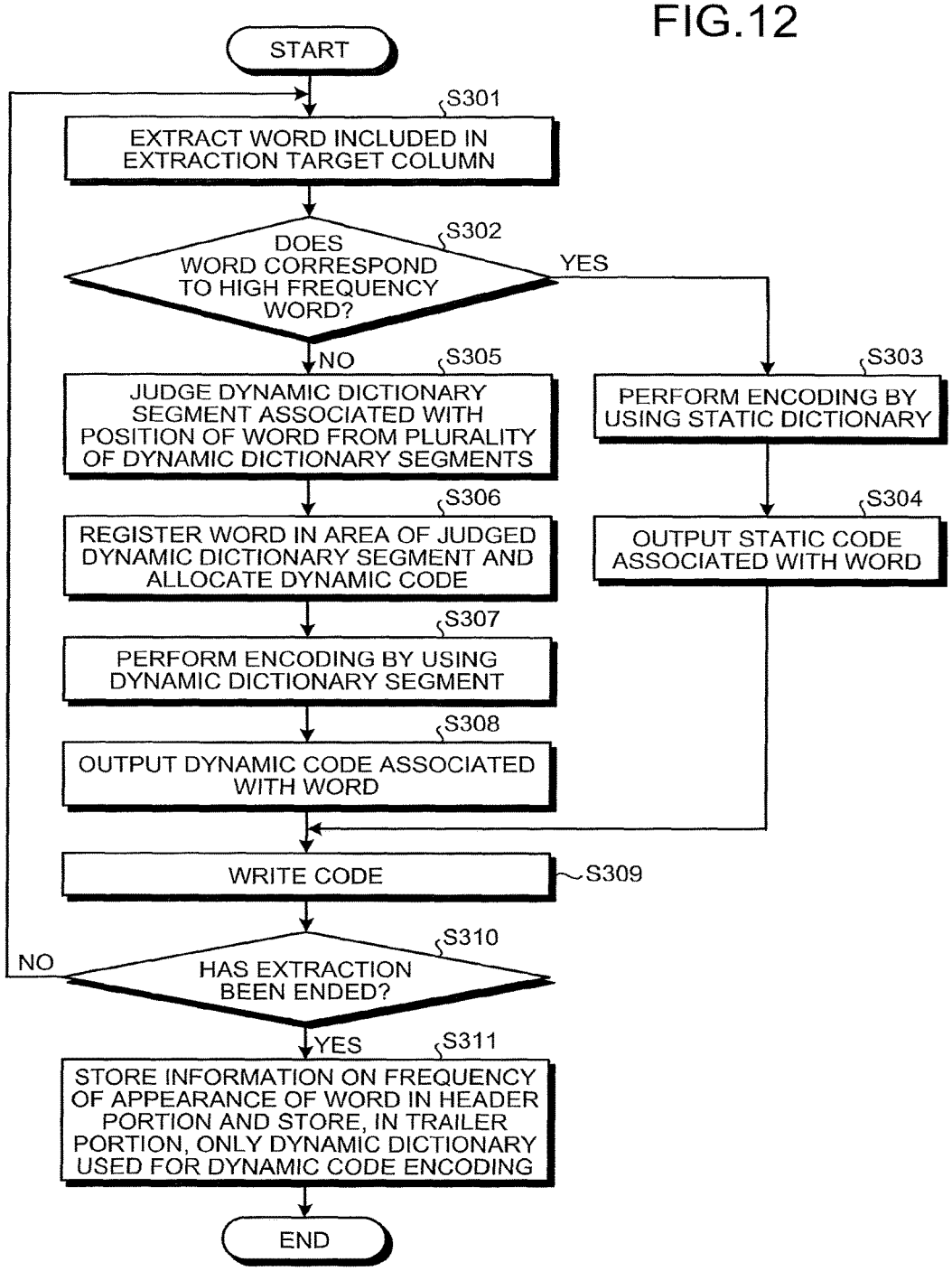
FIG. 12 is a flowchart illustrating the flow of a process performed by an extracting unit according to the second embodiment.

FIG. 12 is a flowchart illustrating the flow of a process performed by an extracting unit according to the second embodiment. As illustrated in FIG. 12, the file read unit 151 in the extracting unit 150 extracts, in units of words from the file F1 corresponding to the encoding target, a word that is included in the column and that is the extraction target (Step S301).

The extraction processing unit 155 in the extracting unit 150 judges whether the word is a high frequency word (Step S302). For example, at Step S302, if the word hits in the static dictionary C2, the extraction processing unit 155 judges that the word is a high frequency word.

If the word is a high frequency word (Yes at Step S302), the extraction processing unit 155 performs encoding based on the static dictionary C2 (Step S303). The extraction processing unit 155 outputs the static code associated with the word to the file write unit 156 (Step S304) and moves to Step S309. In contrast, if the word is not a high frequency word (No at Step S302), the extraction processing unit 155 moves to Step S305.

The extraction processing unit 155 judges, based on the type table 154, the dynamic dictionary segment associated the position of the word from the plurality of dynamic dictionary segment (Step S305). The extraction processing unit 155 registers the word in the area of the judged dynamic dictionary segment and allocates a dynamic code (Step S306). The extraction processing unit 155 performs encoding based on the dynamic dictionary (Step S307) and outputs the dynamic code associated with the word to the file write unit 156 (Step S308).

The file write unit 156 writes the code (static code or dynamic code) to the encoding data portion 4b in the encoding file F4 (Step S309). The extracting unit 150 judges whether extraction of the extraction target in the file F1 has been ended (Step S310). If extraction has not been ended (No at Step S310), the extracting unit 150 moves to Step S301.

If extraction has been ended (Yes at Step S310), the file write unit 156 stores information on the frequency of appearance of the word in the header portion 4a in the encoding file F4 and stores only the dynamic dictionary used for dynamic code encoding in the trailer portion 4c (Step S311).

As described above, the extracting unit 150 creates the encoding file F4 by extracting the word in the column that becomes the extraction target from among the pieces of information included in the file F1 and by performing dynamic code encoding using the dynamic dictionary segment that is associated with the position information. Consequently, it is possible to notify the transmission destination of only the information on the column needed for the transmission destination of the encoding file F4. For example, if a server at the transmission destination previously holds information on the unit price that is associated with a product number, even if information on the unit price included in the column 22a is not notified to the server, when only the information on the product number is notified, the unit price associated with the notified product number can be judged on the server side.

Figure 13:
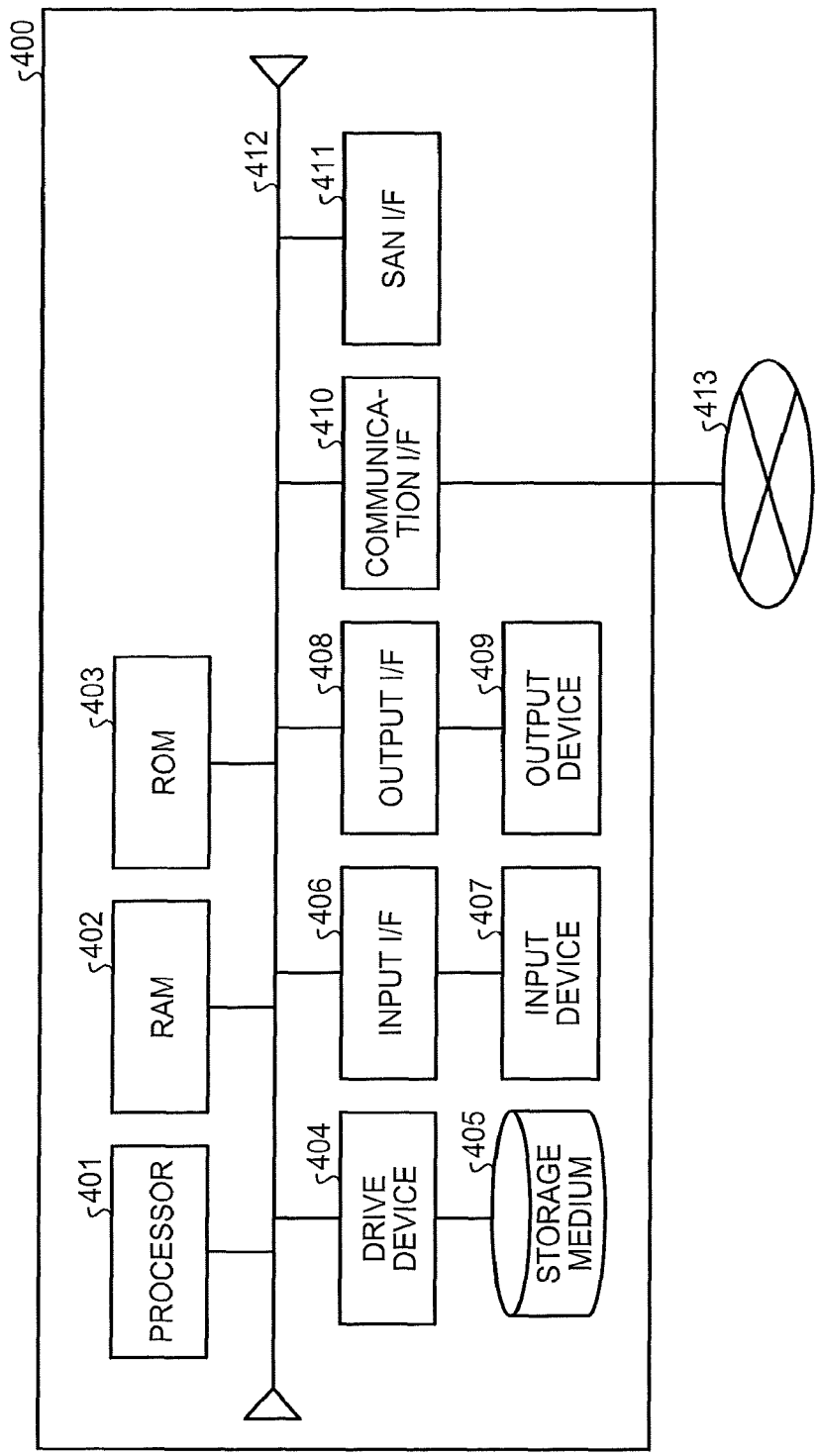
FIG. 13 is a diagram illustrating an example of a hardware configuration of a computer.

In the following, hardware and software used in the embodiments will be described. FIG. 13 is a diagram illustrating an example of a hardware configuration of a computer. A computer 400 includes, for example, a processor 401, a random access memory (RAM) 402, a read only memory (ROM) 403, a drive device 404, a storage medium 405, an input interface (I/F) 406, an input device 407, an output interface (I/F) 408, an output device 409, a communication interface (I/F) 410, a storage area network (SAN) interface (I/F) 411, a bus 412, and the like. Each of the pieces of hardware are connected via the bus 412.

The RAM 402 is a memory device that allows data items to be read and written. For example, a semiconductor memory, such as a static RAM (SRAM), a dynamic RAM (DRAM), or the like, is used or, instead of a RAM, a flash memory or the like is used. The ROM 403 also includes a programmable ROM (PROM) or the like. The drive device 404 is a device that performs at least one of the reading and writing of information recorded in the storage medium 405. The storage medium 405 stores therein information that is written by the drive device 404. The storage medium 405 is, for example, a flash memory, such as a hard disk, a solid state drive (SSD), or the like, or a storage medium, such as a compact disc (CD), a digital versatile disc (DVD), a blue-ray disk, or the like. Furthermore, for example, the computer 400 is provided with the drive device 404 and the storage medium 405 as the plurality types of storage media.

The input interface 406 is a circuit that is connected to the input device 407 and that transmits the input signal received from the input device 407 to the processor 401. The output interface 408 is a circuit that is connected to the output device 409 and that allows the output device 409 to perform an output in accordance with an instruction received from the processor 401. The communication interface 410 is a circuit that controls communication via a network 413. The communication interface 410 is, for example, a network interface card (NIC) or the like. The SAN interface 411 is a circuit that controls communication with a storage device connected to the computer 400. The SAN interface 411 is, for example, a host bus adapter (HBA) or the like.

The input device 407 is a device that sends an input signal in accordance with an operation. The input signal is, for example, a keyboard; a key device, such as buttons attached to the main body of the computer 400; or a pointing device, such as a mouse, a touch panel, or the like. The output device 409 is a device that outputs information in accordance with the control of the computer 400. The output device 409 is, for example, an image output device (display device), such as a display or the like, or an audio output device, such as a speaker or the like. Furthermore, for example, an input-output device, such as a touch screen or the like, is used as the input device 407 and the output device 409. Furthermore, the input device 407 and the output device 409 may also be integrated with the computer 400 or may also be devices that are not included in the computer 400 and that are, for example, connected to the computer 400 from outside.

For example, the processor 401 reads a program stored in the ROM 403 or the storage medium 405 to the RAM 402 and performs, in accordance with the procedure of the read program, the process of the encoding unit 100a or the process of the decompression unit 100b and the extracting unit 150. At this time, the RAM 402 is used as a work area of the processor 401. The function of the storage unit 100c is implemented by the ROM 403 and the storage medium 405 storing program files (an application program 54, middleware 53, an operating system (OS) 52, or the like, which will be described later) or data files (the file F1 that is the compression target, the compressed encoding file F2, or the like) and by the RAM 402 being used as the work area of the processor 401. The program read by the processor 401 will be described with reference to FIG. 14.

Figure 14:
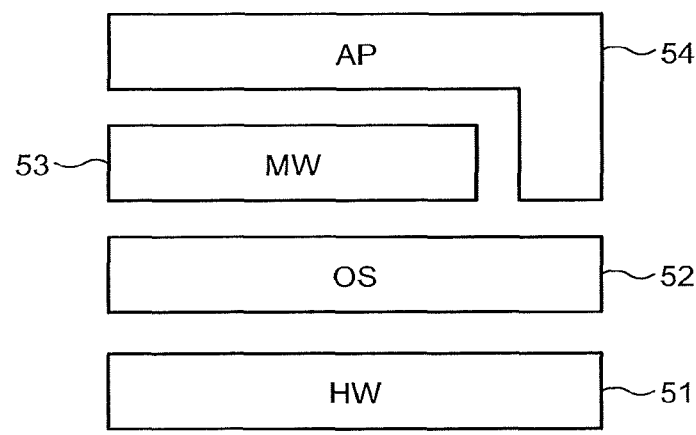
FIG. 14 is a diagram illustrating an example of programs running on the computer.

FIG. 14 is a diagram illustrating an example of programs running on the computer. In the computer 400, the OS 52 that controls a hardware group 51 (401 to 412) illustrated in FIG. 14 is operated. By operating the processor 401 in accordance with the procedure of the OS 52 and by performing control and management of the hardware group 51, the processes in accordance with the application program 54 or the middleware 53 are executed in the hardware group 51. Furthermore, in the computer 400, the middleware 53 or the application program 54 is read in the RAM 402 and is executed by the processor 401.

If an encoding process function is called, the processor 401 performs processes that are based on at least a part of the middleware 53 or the application program 54 (by performing the processes by controlling the hardware group 51 based on the OS 52), whereby the function of the encoding unit 100a is implemented. Furthermore, if a decompression function is called, the processor 401 performs processes that are based on at least a part of the middleware 53 or the application program 54 (by performing the processes by controlling the hardware group 51 based on the OS 52), whereby the function of the decompression unit 100b is implemented. Each of the encoding process function and the decompression function may also be included in the application program 54 itself or may be a part of the middleware 53 that is executed by being called in accordance with the application program 54. If an extraction process function is called, the processor 401 performs processes that are based on at least a part of the middleware 53 or the application program 54 (by performing the processes by controlling the hardware group 51 based on the OS 52), whereby the function of the extracting unit 150 is implemented.

Figure 15:
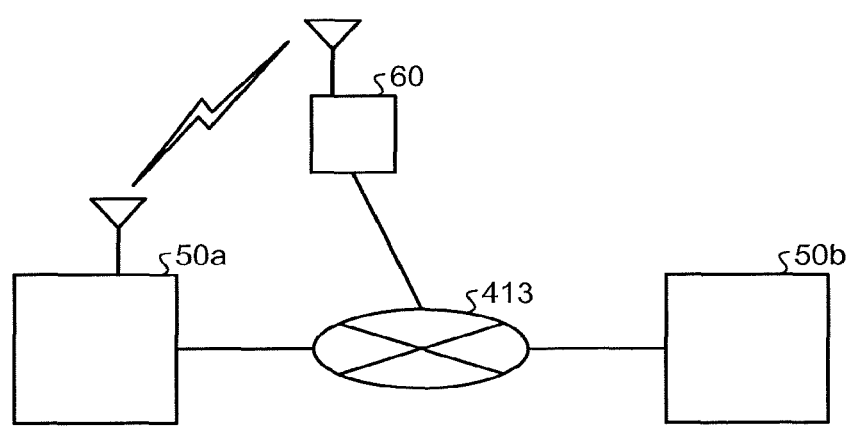
FIG. 15 is a diagram illustrating an example of a configuration of devices in a system according to the embodiments.

FIG. 15 is a diagram illustrating an example of a configuration of devices in a system according to the embodiments. The system illustrated in FIG. 15 includes a computer 50a, a computer 50b, a base station 60, and the network 413. The computer 50a is connected to the network 413 that is connected to the computer 50b by using wireless or wired connection.

The encoding unit 100a and the decompression unit 100b illustrated in FIG. 2 may also be included in either the computer 50a or the computer 50b illustrated in FIG. 15. The computer 50b may also include the encoding unit 100a and the computer 50a may also include the decompression unit 100b, or, alternatively, the computer 50a may also include the encoding unit 100a and the computer 50b may also include the decompression unit 100b. Furthermore, both the computer 50a and the computer 50b may also include the encoding unit 100a and the decompression unit 100b.

In the following, a part of a modification of the above described embodiments will be described. In addition to the modification described below, design changes can be appropriately made without departing from the scope of the present invention. The target for the encoding process may also be, in addition to data in a file, monitoring messages or the like output from a system. For example, a process of encoding the monitoring messages that are sequentially stored in a buffer is performed by the encoding process described above and a process of storing the messages as a log file is performed. Furthermore, for example, encoding may also be performed per page in a database or encoding may also be performed in units of groups of plurality of pages.

Furthermore, in the first embodiment and the second embodiment described above, as a specific example of the position in text data of a word, the position of a column in a file in which a plurality of words is separated by delimiters into a plurality of vertical lines (columns) is used for the explanation. However, the position is not limited to the column position described above. In addition to this, as the position in text data, it is possible to use various kinds of position information on the position defined by a segment, such as a paragraph or a chapter, or the position defined in accordance with the number of words counted from the top.

It is possible to reduce the redundancy of data in a dynamic dictionary.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An encoding method comprising:
reading text data, using a processor; and
encoding text data by using a dynamic dictionary in which codes and words appearing multiple times are associated with the text data, using the processor, wherein
a registration destination area, in the dynamic dictionary, of each of the codes registered in the dynamic dictionary at the encoding is associated with a position, in the text data, of each of the words associated with the codes.

2. The encoding method according to claim 1, wherein
the dynamic dictionary includes a plurality of dynamic dictionary segments, and
the registration destination area is one of the plurality of dynamic dictionary segments.

3. The encoding method according to claim 1, wherein the registration destination area in the dynamic dictionary is linked to the regularity, in the text data, of each of the words associated with the codes.

4. A non-transitory computer readable recording medium having stored therein a creating program that causes a computer to execute a process comprising:
receiving an input of an encoding file obtained by encoding text data by using a dynamic dictionary which associates codes and words appearing multiple times in the text data wherein the dynamic dictionary includes a plurality of dynamic dictionary segments and the plurality of dynamic dictionary segments are linked to a position in the text data, of each of the words associated with the codes; and
creating an extraction dynamic dictionary by extracting a dynamic dictionary segment that is associated with the code that is the extraction target from the plurality of dynamic dictionary segments when receiving an indication of a code that becomes an extraction target, regarding the encoding file.

5. The non-transitory computer readable recording medium according to claim 4, further comprising
creating, based on the extraction dynamic dictionary, an automaton in which the code that becomes the extraction target is associated with the word in the dynamic dictionary, and
replacing, based on the created automaton, the code that becomes the extraction target with the word.

6. An encoding device comprising:
a processor executes a process comprising:
reading text data; and
encoding the text data by using a dynamic dictionary in which codes and words appearing multiple times are associated with the text data, wherein
a registration destination area, in the dynamic dictionary, of each of the codes registered in the dynamic dictionary at the encoding is associated with a position, in the text data, of each of the words associated with the codes.

7. The encoding device according to claim 6, wherein the registration destination area in the dynamic dictionary is linked to the regularity, in the text data, of each of the words associated with the codes.

8. A decoding device comprising:
a processor executes a process comprising:
receiving an input of an encoding file obtained by encoding text data by using a dynamic dictionary which associates codes and words appearing multiple times in the text data wherein the dynamic dictionary includes a plurality of dynamic dictionary segments and the plurality of dynamic dictionary segments are linked to a position in the text data, of each of the words associated with the codes; and
creating an extraction dynamic dictionary by extracting a dynamic dictionary segment that is associated with the code that is the extraction target from the plurality of dynamic dictionary segments when receiving an indication of a code that becomes an extraction target, regarding the encoding file.

9. The decoding device according to claim 8, further comprising
creating, based on the extraction dynamic dictionary, an automaton in which the code that becomes the extraction target is associated with the word in the dynamic dictionary, and
replacing, based on the created automaton, the code that becomes the extraction target with the word.

* * * * *